(12) United States Patent
Amos et al.

(10) Patent No.: US 6,785,320 B1
(45) Date of Patent: Aug. 31, 2004

(54) CONTROL OF POLARISATION OF VERTICAL CAVITY SURFACE EMITTING LASERS

(75) Inventors: Richard M Amos, Worcestershire (GB); Meirion F Lewis, Worcestershire (GB); Rebecca A Wilson, Worcestershire (GB)

(73) Assignee: QinetiQ Limited, Farnborough (GB)

( * ) Notice: Subject to any disclaimer, the term of this patent is extended or adjusted under 35 U.S.C. 154(b) by 0 days.

(21) Appl. No.: 10/019,956

(22) PCT Filed: Jul. 10, 2000

(86) PCT No.: PCT/GB00/02550
§ 371 (c)(1),
(2), (4) Date: Feb. 12, 2002

(87) PCT Pub. No.: WO01/05008
PCT Pub. Date: Jan. 18, 2001

(30) Foreign Application Priority Data

Jul. 10, 1999 (GB) .............................. 9916145

(51) Int. Cl.⁷ .......................... H01S 3/08; H01S 31/109
(52) U.S. Cl. ......................................... 372/102; 257/21
(58) Field of Search ................. 372/92–96; 257/21, 257/96, 98

(56) References Cited

U.S. PATENT DOCUMENTS

| | | | |
|---|---|---|---|
| 5,255,574 A | | 10/1993 | Wuerschum |
| 5,331,654 A | * | 7/1994 | Jewell et al. ................. 372/45 |
| 5,555,255 A | | 9/1996 | Kock et al. |
| 5,818,066 A | * | 10/1998 | Duboz ........................ 257/21 |
| 5,877,519 A | * | 3/1999 | Jewell ........................ 257/190 |
| 5,953,362 A | * | 9/1999 | Pamulapati et al. .......... 372/96 |
| 5,960,024 A | * | 9/1999 | Li et al. ........................ 372/96 |
| 6,031,243 A | * | 2/2000 | Taylor ........................ 257/13 |
| 6,055,262 A | * | 4/2000 | Cox et al. ..................... 372/96 |
| 6,191,890 B1 | * | 2/2001 | Baets et al. ................. 359/572 |
| 6,222,871 B1 | * | 4/2001 | Chang-Hasnain et al. .... 372/96 |
| 2002/0044351 A1 | * | 4/2002 | Nilsen ........................ 359/483 |

FOREIGN PATENT DOCUMENTS

| | | |
|---|---|---|
| EP | 0 442 002 A | 8/1991 |
| EP | 0 798 574 A | 10/1997 |

OTHER PUBLICATIONS

Ser J–H et al; "Polarization Stabilization of Vertical–Cavity Top–Surface–Emitting Lasers by Inscription of Fine Metal–Interlaced Gratings" Applied Physics Letters, US, American Institute of Physics, New York; vol. 66, No. 21; May 22, 1995; pp. 2769–2771; XP000507414.

Goeman S et al; "First Demonstration of Highly Reflective and Highly Polarization Selective Diffraction Gratings (Giro–Gratings) for Long–Wavelength VCSEL'S"; IEEE Photonics Technology Letters, US, IEEE Inc., New York; vol. 10, No. 9; Sep. 1, 1998; XP000783211.

* cited by examiner

*Primary Examiner*—Don Wong
*Assistant Examiner*—Phillip Nguyen
(74) *Attorney, Agent, or Firm*—Nixon & Vanderhye P.C.

(57) ABSTRACT

A vertical cavity surface emitting laser (VCSEL) comprising a one dimensional grating structure configured to act as a waveguide, preferably located at an end surface of the VCSEL, for selectively reflecting more of a first polarisation of light back into the cavity of the VCSEL than a second orthogonal polarisation of light. Preferably the VCSEL comprises an upper Bragg mirror, a gain region, and a lower Bragg mirror, and the one dimensional grating structure is located on a top layer of the upper Bragg mirror and the top layer of the upper Bragg mirror has a thickness such that the reflected light of one polarisation constructively interferes with light of said one polarisation which is reflected by the upper Bragg mirror. The VCSEL will then lase at the polarisation which is more predominantly reflected by the grating structure.

28 Claims, 5 Drawing Sheets

CONTROL OF POLARISATION OF VERTICAL CAVITY SURFACE EMITTING LASERS

This application is the U.S. national phase of international application PCT/GB00/02250, filed in English on Jul. 10, 2000 which designated the U.S. PCT/GB00/02550 claims priority to GB Application No. 9916145.7 filed Jul. 10, 1999. The entire contents of these applications are incorporated herein by reference.

BACKGROUND OF THE INVENTION

1. Field of the Invention

The present invention relates to the control of the polarisation of light emitted by Vertical Cavity Surface Emitting Lasers or VCSELs.

2. Discussion of Prior Art

Recently there has been increased interest in VCSELs because they have several potential advantages over conventional edge emitting semiconductor lasers, such as planar construction, the emission of light perpendicular to the surface of the semiconductor substrate and the possibility of fabrication in an array. Edge emitting lasers have the advantage of emitting polarised light, however they emit an elliptical beam of polarised light which requires the use of a lens to couple the elliptical beam to a circular optical fibre. By comparison VCSELs which in their simplest form have a semiconductor structure which is axially symmetric about the vertical axis of the VCSEL will emit a circular beam of light which is unpolarised. A circular beam can be directly coupled into a circular optical fibre without the use of a lens, or at least using a simplified lens structure.

For many proposed applications for VCSELs, such as sources for spatial light modulators, it is desirable, and in some cases necessary to have single mode operation of VCSELs with a well defined polarisation of light, that is, the direction of the electric field vector of the light emitted by the VCSEL has to be well defined and must not change with current or temperature. To achieve this a differential gain has to be introduced for two orthogonal polarisations of light generated in the gain region of the VCSEL.

This problem has been tackled by altering the semiconductor structure of the VCSEL from a simple axially symmetrical structure to a more complex structure in which the VCSEL comprises a waveguide which preferentially supports one orthogonal polarisation. This approach is used in JP10223973 and EP772269 and results in a more complicated semiconductor structure which can reduce the circular symmetry of the beam of light generated by the VCSEL. EP772269 also discloses the use of a non-symmetrical emission port on a VCSEL to promote one orthogonal polarisation, but again this will reduce the circular symmetry of the beam of light generated by the VCSEL. U.S. Pat. No. 5,727,014 also discloses the use of a non-symmetrical emission port on a VCSEL, which port is surrounded by an electrode of the VCSEL.

In U.S. Pat. No. 5,412,680 the active layer of the VCSEL comprises at least one strained semiconductor layer having a preferential direction of electrical conductivity along a direction parallel to the mirrors of the VCSEL so that the VCSEL emits light having a polarisation substantially parallel to this preferential direction. However, this straining of the semiconductor material adds complexity to the structure of the VCSEL. Furthermore, the strained layer must be relatively thin and such thin layers are difficult to reproduce accurately in bulk manufacture, resulting in VCSELs whose properties are not very reproducible. Alternatively, the active layer of the VCSEL can be elongated so that the polarisation of the radiation emitted by the VCSEL is parallel to the longitudinal axis of the active layer. In GB 2,311,166 a multi-layer polymeric Bragg reflector is stretched to orient polymer molecules to define a direction of polarisation.

In JP09181391 the VCSELs are grown with their axes of symmetry inclined to the vertical in order to promote the generation of one orthogonal polarisation. However, the inclined structure of the VCSELs complicates the fabrication process used to form the individual VCSELs because undercutting will be required.

In JP09283859 and JP09283860 ring electrodes on one end surface of a VCSEL are used to switch between two orthogonal polarisations.

SUMMARY OF THE INVENTION

The present invention aims to provide a VCSEL which overcomes at least some of the problems discussed above. In particular the present invention aims to provide a VCSEL which emits a circular beam of polarised light and yet which maintains a simple structure to ease fabrication.

According to a first aspect of the present invention there is provided a vertical cavity surface emitting laser (VCSEL) comprising a one dimensional grating structure located at an end of the VCSEL for selectively promoting the gain of a first polarisation of light within the VCSEL as compared to the gain of a second orthogonal polarisation of light within the VCSEL. The VCSEL will therefore tend to lase at the first polarisation.

Thus, a polarisation controlled VCSEL is provided using a standard VCSEL structure with only one additional structure added to one of its ends. Thus, fabrication of a VCSEL according to the present invention can be simplified relative to the polarisation controlled VCSELs already known in the prior art. Furthermore, the arrangement according to the present invention will not reduce the symmetry of the circular beam emitted by the VCSEL. The present invention also enables arrays of polarisation controlled VCSELs of the same polarisation to be fabricated by fabricating the same one dimensional grating structure over the entire array of VCSELs in a single processing step.

Preferably, the one dimensional grating structure is located at an end of the VCSEL as this generates a structure that is simple and relatively easy to fabricate.

In a preferred embodiment the one dimensional grating structure is located at the top end of the VCSEL. This is preferred particularly if the grating structure is made of metal because it is presently not possible to grow the layers of semiconductor material that make up a VCSEL over a layer of metal.

The polarisation controlled VCSELs according to present invention can be arranged to emit light from their top end surface or from their bottom end surface as required.

In one embodiment the one dimensional grating structure can reflect both the first and second orthogonal polarisations of light back into the cavity of the VCSEL. The gain of the first polarisation can then be selectively promoted by arranging light of the first polarisation reflected by the grating structure to interfere constructively with other light of the first polarisation reflected back into the VCSEL cavity (eg. due to the arrangement of the layers of a Bragg mirror, and/or by arranging for light of the second orthogonal polarisation reflected by the grating structure to interfere destructively with other light of the second polarisation reflected back into the VCSEL cavity.

In an alternative embodiment the one dimensional grating structure can be arranged to preferentially reflect the first polarisation of light back into the cavity of the VCSEL. The VCSEL then will tend to lase at the first polarisation which is preferentially reflected back into the cavity of the VCSEL, provided it is reflected back in such a way that it is in phase with the light of the first polarisation which is also reflected back into the laser cavity, for example by the layers of a Bragg stack mirror. This is because there will be a higher electric field intensity within the cavity, ie. a higher gain, at this first polarisation.

The one dimensional grating structure can be arranged to preferentially absorb the second orthogonal polarisation of light, so that the VCSEL lases with the first preferentially reflected polarisation of light.

The one dimensional grating structure can be arranged to preferentially transmit the first orthogonal polarisation of light with the advantage that if the VCSEL is arranged to lase with this first polarisation, light can be coupled out of the VCSEL via the one dimensional grating structure.

In embodiments of the present invention in which the VCSEL also includes a Bragg stack adjacent to the one dimensional grating structure for reflecting light back into the cavity of the VCSEL, it is preferred that the structure of the VCSEL is arranged such that the grating structure and the Bragg stack reflect the first polarisation of light back into the VCSEL cavity substantially in phase to promote constructive interference between the reflected light of the first polarisation. Alternatively, or in addition to this, the structure of the VCSEL can be arranged such that the grating structure and the Bragg stack reflect the second polarisation of light back into the VCSEL cavity substantially out of phase to promote destructive interference between the reflected light of the second polarisation.

The VCSEL according to the present invention preferably comprises an upper Bragg mirror, a gain region, and a lower Bragg mirror, and the grating structure is located in an end layer of the VCSEL and the end layer and/or optionally an adjacent layer of the Bragg mirror has a thickness such that the reflected light, reflected by the one dimensional grating structure, of the first polarisation constructively interferes with light of that first polarisation which is reflected by said one of the Bragg mirrors (i.e it is in phase). As described above this ensures that the VCSEL lases with the first polarisation, eg. the polarisation that is preferentially reflected by the one dimensional grating structure. Alternatively or additionally, said end layer or said adjacent layer of the Bragg mirror may have a thickness such that the reflected light of the second polarisation, reflected by the one dimensional grating structure, destructively interferes with light of that second polarisation which is reflected by the said one of the Bragg mirrors (i.e. it is out of phase). This ensures that the electric field intensity in the cavity is smaller for the second polarisation due to the destructive interference than for the first polarisation. This can be the case even if the second polarisation of light is preferentially reflected back into the VCSEL cavity because, for example, the first polarisaton is preferentially transmitted by the grating structure in order to couple light of the first polarisation out of the VCSEL.

Where the layers of the Bragg mirror are planar and the one dimensional diffraction grating structure is not located at an end of the VCSEL, any layers of a Bragg mirror located above the grating structure (in the direction of VCSEL growth) would have to be planarised as part of the fabrication process. An alternative would be to use a Bragg mirror having corrugated layers and by arranging the corrugations in the Bragg layers to have dimensions corresponding to the dimensions of the corrugations of the grating structure.

In a first preferred embodiment the one dimensional grating structure comprises a corrugated metal mirror arranged such that light of a polarisation with the electric vector perpendicular to the grating grooves incident on the corrugated metal mirror generates surface plasmon polaritons. This polarisation is preferentially absorbed by the corrugated metal mirror and the orthogonal polarisation is preferentially reflected by the corrugated metal mirror back into the VCSEL cavity. Preferably the pitch of the corrugations of the corrugated metal mirror $\lambda_G$ is determined by the following equation:

$$2\pi m/\lambda_G = K_{SPP}$$

where $K_{SPP}$ is the wave vector of the surface plasmon polaritons, and m is an integer. Ideally one would choose m=1 so that there are no diffracted orders (i.e. the grating is zero order). The corrugated metal mirror may be made of any metal, preferably one which also acts as a good electrical contact (e.g. gold).

According to this first preferred embodiment the surface plasmon polaritons may be generated at the interface between the corrugated metal mirror and an upper Bragg mirror of the VCSEL. In this configuration the VCSEL will be bottom emitting. However, a top emitting VCSEL can be produced if the surface plasmon polaritons are generated at the interface between the corrugated metal mirror and air, which is possible if the one dimensional metal grating is optically thin (about one wavelength in thickness). This also increases $\lambda_G$, making the corrugated metal mirror simpler to fabricate.

A second preferred embodiment comprises a VCSEL having a one dimensional grating structure comprising a first order one dimensional diffraction grating which is formed as a layer of the VCSEL, preferably as an end layer of the VCSEL, and said layer is configured to act as a waveguide in a direction perpendicular to the axis of the VCSEL and the grating has a pitch chosen so that part of the light from the VCSEL cavity incident normal to the grating grooves is reflected directly back into the VCSEL cavity and part of light from the VCSEL cavity incident normal to the grating grooves is indirectly reflected back into the VCSEL by being diffracted into the waveguide and subsequently diffracted back out of the waveguide and into the VCSEL cavity, in such a way that for the second polarisation of light the indirectly reflected light interferes destructively with the directly reflected light. The first order one dimensional diffraction grating may be made of either a dielectric material or a metal. The pitch of the grating is chosen so that part of the light from the VCSEL cavity incident normal to the grating grooves is diffracted at the interface between the top of the grating and the medium above it (eg. air) into the waveguide formed by the grating layer, producing a diffraction beam which travels at some angle θ to the grating normal. This diffracted beam is reflected further along the waveguide when it is incident on the interface between the grating and the top of an adjacent Bragg mirror and then diffracts from the interface at the top of the grating once more to produce a beam travelling normal to the grating grooves back into the VCSEL cavity. The phase of this indirectly reflected beam depends upon the grating pitch, the thickness of the layer in which the grating is formed and crucially on the polarisation of the light. Thus a grating pitch and layer thickness can be chosen such that for the second polarisation the overall reflectivity of the Bragg stack-grating combination is very low (due to destructive interference between the directly and indirectly reflected light) whilst for the first orthogonal polarisation the reflectivity is very high. In this case the VCSEL will lase with the first polarisation as this has the highest gain.

According to a second aspect of the present invention there is provided a method of controlling the polarisation of light emitted by a vertical cavity surface emitting laser (VCSEL) comprising the steps of using a one dimensional grating structure, preferably located at an end of the VCSEL, to selectively promote the gain of a first polarisation of light within the VCSEL as compared to the gain of a second orthogonal polarisation of light within the VCSEL. The method according to the second aspect of the present invention has the same advantages and preferred features as the VCSEL according to the first embodiment of the present invention.

According to a first preferred embodiment of the second aspect of the present invention there is provided a method of controlling the polarisation of light emitted by a vertical cavity surface emitting laser (VCSEL) comprising the steps of using a one dimensional grating structure to preferentially promote the gain of a first polarisation of light as compared to the gain of a second polarisation of light within the VCSEL wherein the one dimensional grating structure comprises a first order one dimensional diffraction grating which is formed as a layer of the VCSEL and said layer is configured to act as a waveguide in a direction perpendicular to the axis of the VCSEL and the grating has a pitch chosen so that part of the light from the VCSEL cavity incident normal to the grating grooves is reflected directly back into the VCSEL cavity and part of the light from the VCSEL cavity incident normal to the grating grooves is indirectly reflected back into the VCSEL by being diffracted into the waveguide and the subsequently diffracted back out of the waveguide and into the VCSEL cavity, in such a way that for the second polarisation of light the indirectly reflected light interferes destructively with the directly reflected light.

According to a second preferred embodiment of the second aspect of the present invention the one dimensional grating structure comprises a corrugated metal mirror arranged such that light of the second polarisation incident on the mirror excites surface plasmon polaritons. Preferably, the pitch of the one dimensional corrugated metal mirror, $\lambda_G$, is determined by the following equation $$2\pi/\lambda_G = K_{SPP}$$

where $K_{SPP}$ is the wave vector of the surface plasmon polaritons.

The method may comprise the step of generating the surface plasmon polaritons at the interface between the one dimensional corrugated metal mirror and an upper Bragg mirror of the VCSEL. Alternatively it may comprise the step of generating the surface plasmon polaritons at the interface between the one dimensional corrugated metal mirror and air.

The present invention will now be described with reference to the accompanying drawings in which.

DETAILED DISCUSSION OF EMBODIMENTS

Figure 1:
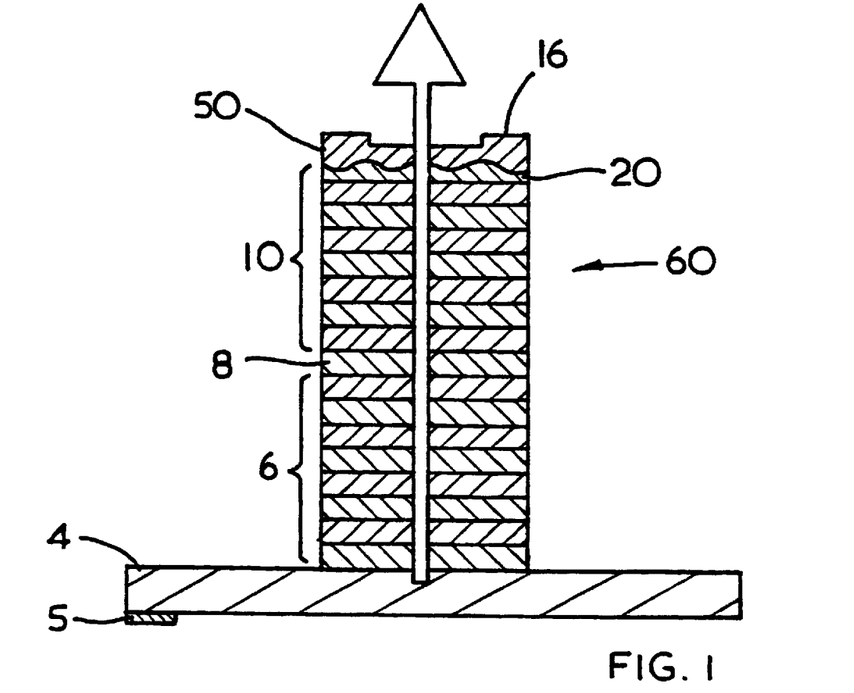
FIG. 1 shows schematically a cross section of a top emitting VCSEL according to a first embodiment of the present invention.

FIG. 1 shows an embodiment of a polarising VCSEL (60) according to a first embodiment of the present invention. The VCSEL (60) is grown on a substrate (4) which includes the bottom electrical contact (5) of the VCSEL and comprises a lower multi-layer Bragg stack or mirror (6), a gain region (8) and an upper multi-layer Bragg stack or mirror (10). The upper Bragg mirror (10) is partially reflecting and so light is emitted from the VCSEL (60) from its upper surface. On the upper surface is formed the top electrical contact of the VCSEL which is in the form of a corrugated metal mirror (50) surrounded by an annular region (16). As is well known in the art the gain region (8) consists of quantum wells. Normally the thickness of each layer in each of the Bragg stacks (6,10) are one quarter of the operating wavelength in the semiconductor material (i.e. the wavelength in air divided by four times the refractive index of the Bragg layer).

The substrate (4) is composed of Gallium Arsenide (GaAs) and the layers of the lower and upper Bragg mirrors (6,10) are made from alternating layers of Aluminium Arsenide (AlAs) and Aluminium Gallium Arsenide (AlGaAs). The lasing region of the VCSEL (60) is defined by the physical removal of material to form a small pillar which forms the VCSEL (60) as is shown in FIG. 1. Alternatively the lasing region could be defined by forming apertures using ion implantation or oxidisation using a mask to render exposed regions electrically non-conductive. The GaAs substrate (4) is transparent above a wavelength of around 980 nm (the actual cut-off wavelength depends on the doping levels and materials in the substrate (4)). Above this wavelength the VCSEL (60) can either be top emitting (as shown in FIG. 1) or bottom emitting. Below 980 nm the VCSEL has to be top emitting.

Surface plasmon polaritons (SPPs) are surface electromagnetic waves that propagate at the interface between a metal (in this case the metal mirror (50)) and a dielectric (in this case the top layer (20) of the upper Bragg mirror (10)). The SPP waves are transverse mode (TM) polarised. The dispersion relation for SPPs is given by:

$$K_{SPP} = K_0[\epsilon_1\epsilon_2/(\epsilon_1+\epsilon_2)]^{1/2}$$

where $K_{SPP}$ is the surface plasmon wave vector $K_0$ is the wave vector of a photon in free space with the same frequency, and $\epsilon_1$ and $\epsilon_2$ are the real parts of the relative permittivities of the metal and the dielectric respectively.

Figure 5:
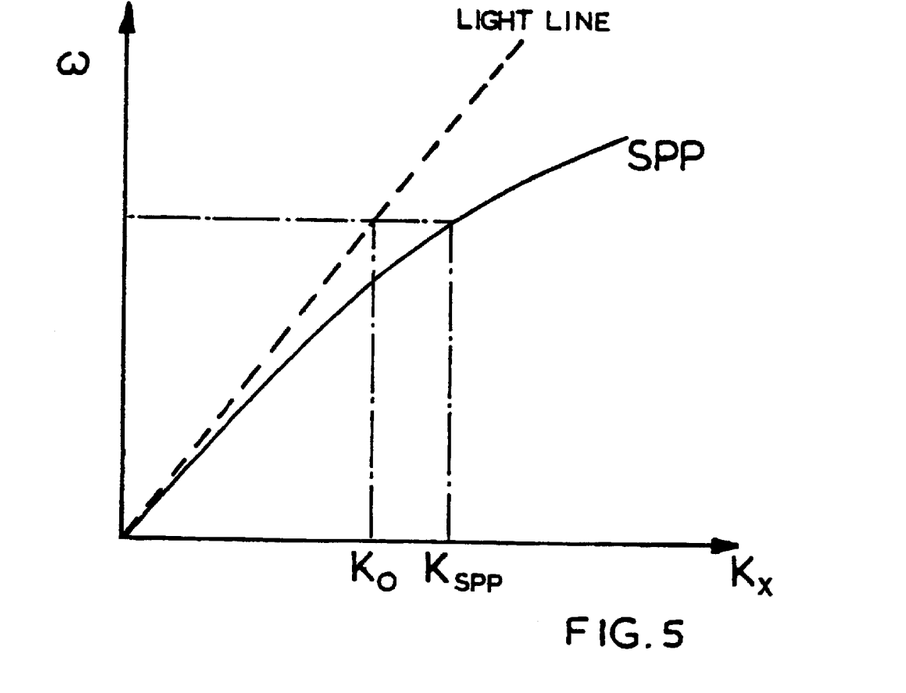
FIG. 5 shows the dispersion relation for surface plasmon polaritons on a metal surface (a graph of wave vector ($k_x$,) against frequency ($\omega$))

The dispersion relation of in-plane wave vector $k_x$ against frequency ωfor an SPP wave is shown by the solid line in FIG. 5. The dotted line in FIG. 5 is called the light line and corresponds to the maximum inplane momentum of a photon in the dielectric, i.e. at grazing incidence. Points to the left of the light line correspond to light propagating at some angle to the plane of the grating. The $k_x=0$ line corresponds to light incident normal to the grating.

It can be seen from the graph in FIG. 5 that an SPP wave has a greater wave-vector than that of a photon of the same frequency because the SPP wave line lies to the right of the light line in FIG. 5. In order to excite a SPP with incident light the momentum of the incident photon must be enhanced to match the momentum of the SPP mode. This can be achieved by the use of a grating. If the pitch $\lambda_G$ of the grating comprising the corrugated mirror is chosen correctly, coupling between the electromagnetic field of an incident photon and surface charges can occur for light at normal incidence. When coupling occurs the specular reflectivity of the grating is reduced. The coupling efficiency is dependent on the grating amplitude and if chosen correctly the reflectivity can be reduced to zero. This is only true however, if there is a normal component of the electric field of the incident photon to the surface of the metal, otherwise SPPs cannot be produced. Thus at normal incidence only light polarised with the electric vector perpendicular to the grating grooves will excite SPPs, the orthogonal polarisation does not have a normal component of the electric vector to the metal surface and so cannot generate the required surface charge.

Figure 2:
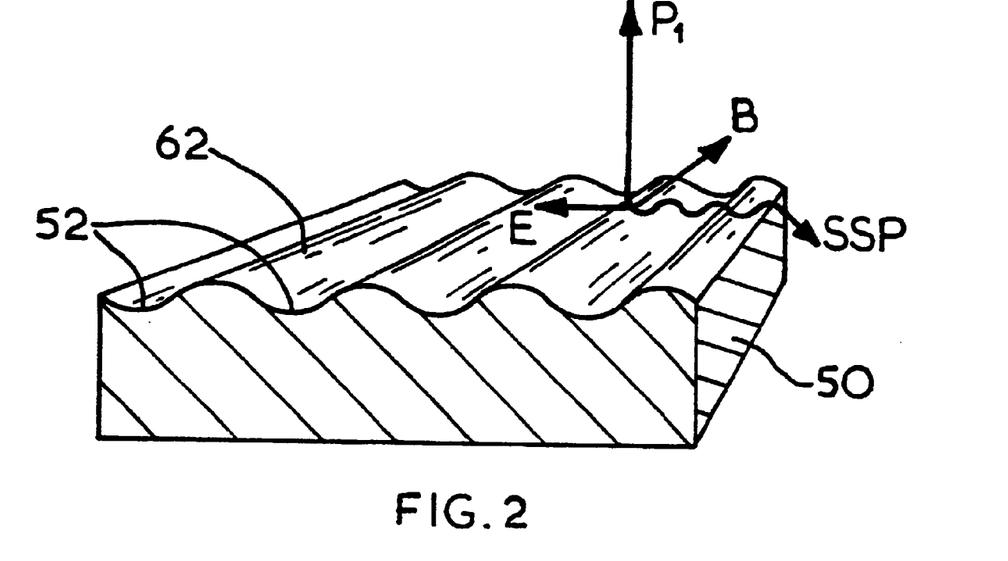
FIG. 2 shows schematically the corrugated surface of a mirror used in the VCSELs according to the first embodiment of the present invention when an incident light wave of polarisation $p_1$ is incident on it.
Figure 3:
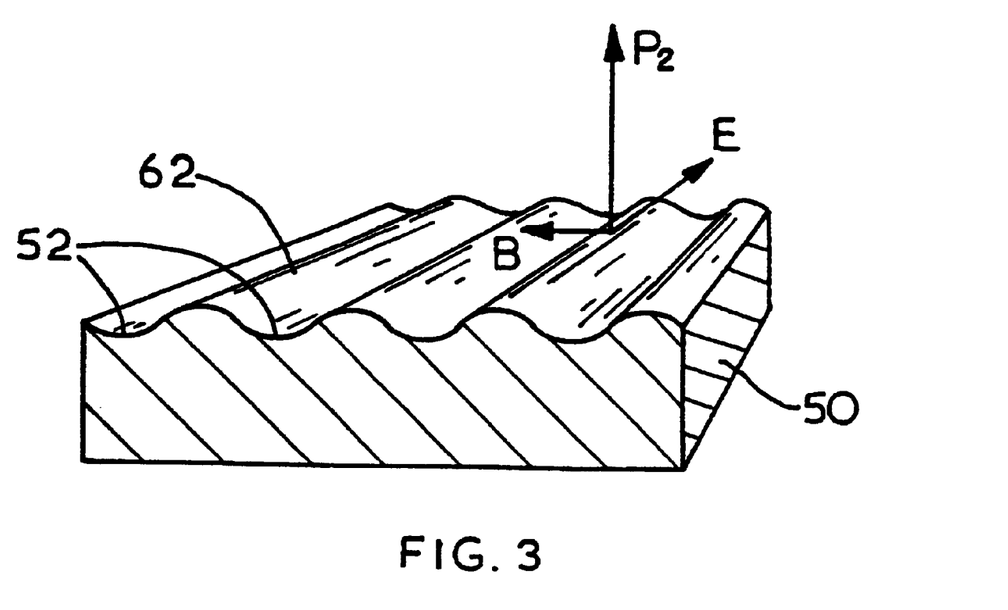
FIG. 3 shows schematically the corrugated surface of a mirror used in the VCSELs according to the first embodiment of the present invention when an incident light wave of polarisation $p_2$, orthogonal to polarisation $p_1$ is incident on it.
Figure 4:
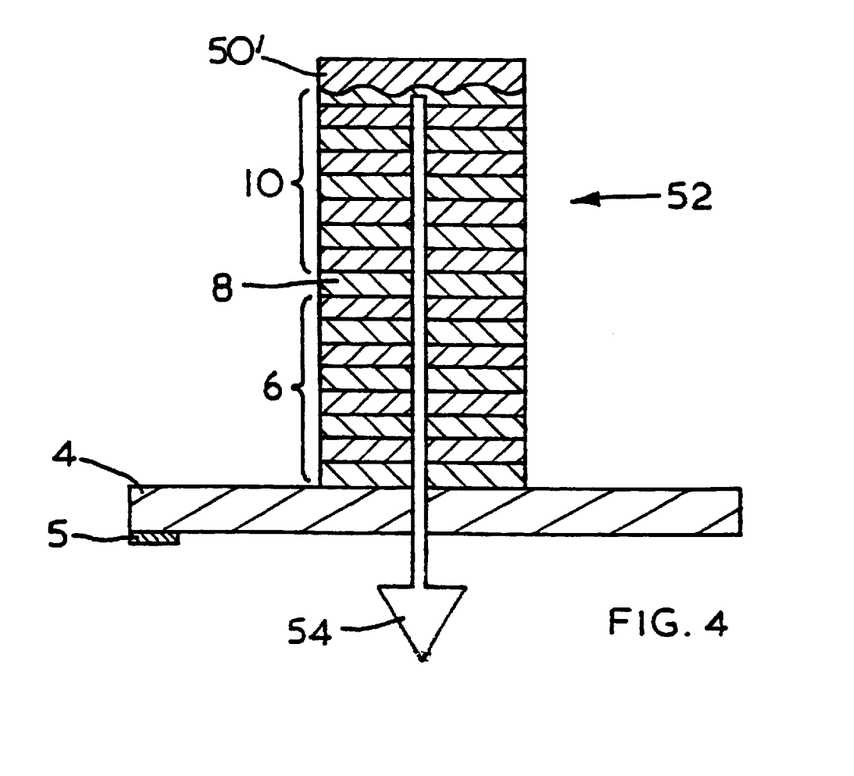
FIG. 4 shows schematically a cross section of a bottom emitting VCSEL according to a first embodiment of the present invention.
Figure 6:
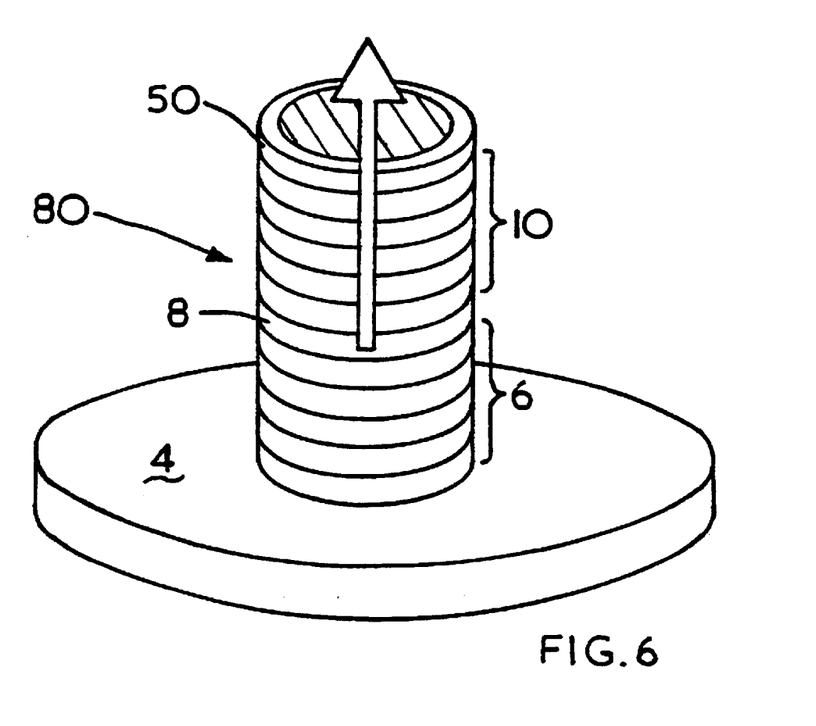
FIG. 6 shows schematically a perspective view of a top emitting VCSEL according to a first embodiment of the present invention.

FIGS. 2 and 3 show the corrugated surface (62) of the mirror (50) which interfaces with the top layer (20) of the upper Bragg mirror (10) in the embodiments of FIGS. 1 and 4 and which interfaces with the air above the VCSEL in the embodiment of FIG. 6. The reflectivity of the grating (50) will fall to zero for the case shown in FIG. 2 in which the electric field vector (E) of incident light of polarisation $p_1$ from within the VCSEL is perpendicular to the grating grooves (52) if the amplitude of the grating is chosen correctly. When the electric field vector (E) of incident light from within the VCSEL of orthogonal polarisation $p_2$ is parallel to the grating grooves (52), there is no normal component as shown in FIG. 3. Consequently, in the situation shown in FIG. 3 SPPs cannot be excited and the reflectivity of the grating (50) is close to 100%. Thus, the mirror (50) acts as a differential absorber for orthogonal polarisations of incident light.

The pitch $\lambda_G$ of the grating comprising the corrugated mirror (50) required to achieve coupling is given by the following momentum matching condition:

$$2\pi/\lambda_G = K_{SPP}$$

The VCSEL (52) of FIG. 4 is a bottom emitting VCSEL. The VCSEL (52) emits light represented by arrow (54) through the substrate (4). A thick corrugated metal mirror (50) is located at the top of the upper Bragg mirror (10) which also forms the top electrode of the VCSEL. The metal mirror (50) is corrugated such that when the E field of incident light is parallel to the grooves in the mirror (50) (ie. in a polarisation $p_2$) the reflectivity of the mirror (50) is close to 100%. However, when the E-field of incident light is perpendicular to the grooves in the mirror (50) (ie. in orthogonal polarisation pi) the reflectivity of the mirror (50) is substantially reduced and light of this second polarisation is absorbed in the mirror (50) and thus lost from the cavity of the VCSEL (52). Thus, at the threshold current of the VCSEL (52) the VCSEL (52) will lase at a polarisation with its E field parallel to the grooves in the mirror (50).

FIG. 1 shows an alternative to the embodiment shown in FIG. 4 which is top emitting. In this case the metal mirror (50) on the top of the upper Bragg mirror (10) has a thickness which is small enough to allow some light of polarisation $p_1$ to be transmitted through it. It may be necessary to decrease the number of layers in the upper Bragg mirror (10) to achieve the desired level of transmission.

Alternatively the thickness of the top Bragg layer (20) can be chosen such that the strong reflection for light polarised with the electric vector parallel to the grating grooves destructively interferes with the reflections from the rest of the Bragg stack, thus reducing the overall reflectivity, and hence reducing the gain for this polarisation. Light polarised orthogonal to this with the electric vector perpendicular to the grating grooves is simply absorbed by the grating structure (i.e. excites SPPs). However the reflectivity of the overall mirror is still high due to the rest of the Bragg stack, and hence lasing will occur for the light polarised with the electric vector perpendicular to the grating grooves.

A more practical alternative to those of FIGS. 1 and 4 is shown in FIG. 6 with like parts denoted by the same numerals. In the VCSEL (80) of FIG. 6 the corrugated surface of the mirror (50) is uppermost and interfaces with the air above the VCSEL (80). In this way SPPs are excited by light travelling through the mirror (50) (which must be thin enough for light to pass through it) from within the VCSEL (8) at the metal/air interface of the corrugated mirror (50). In this case the pitch of the mirror grating would be slightly less than the operating wavelength in air and so is much easier to fabricate.

Figure 7:
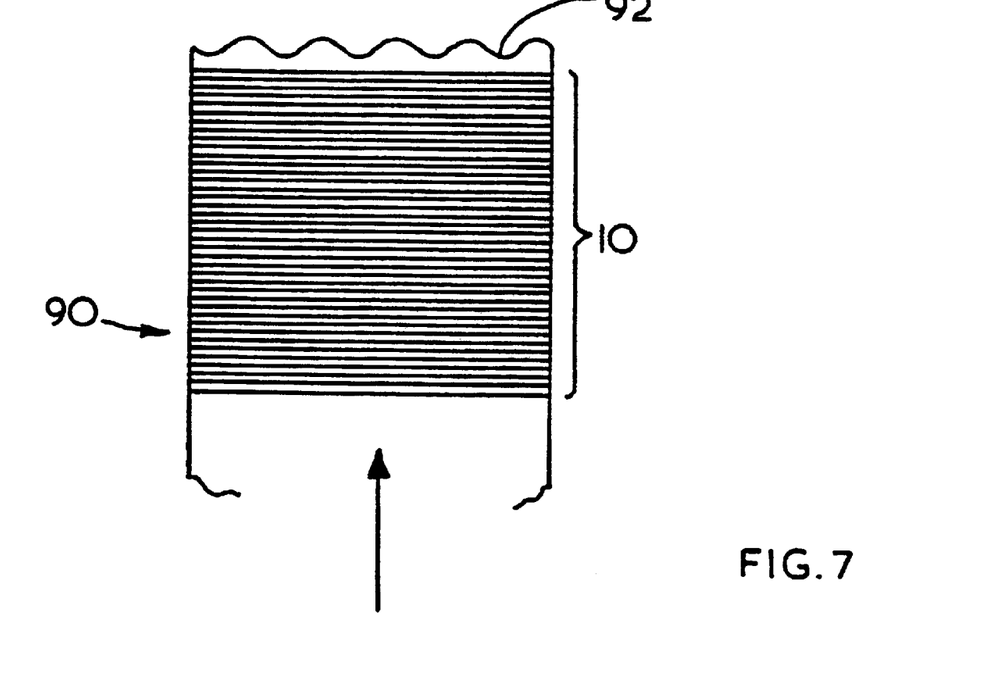
FIG. 7 shows schematically a cross section through the top part of a VCSEL according to a second embodiment of the present invention.
Figure 8:
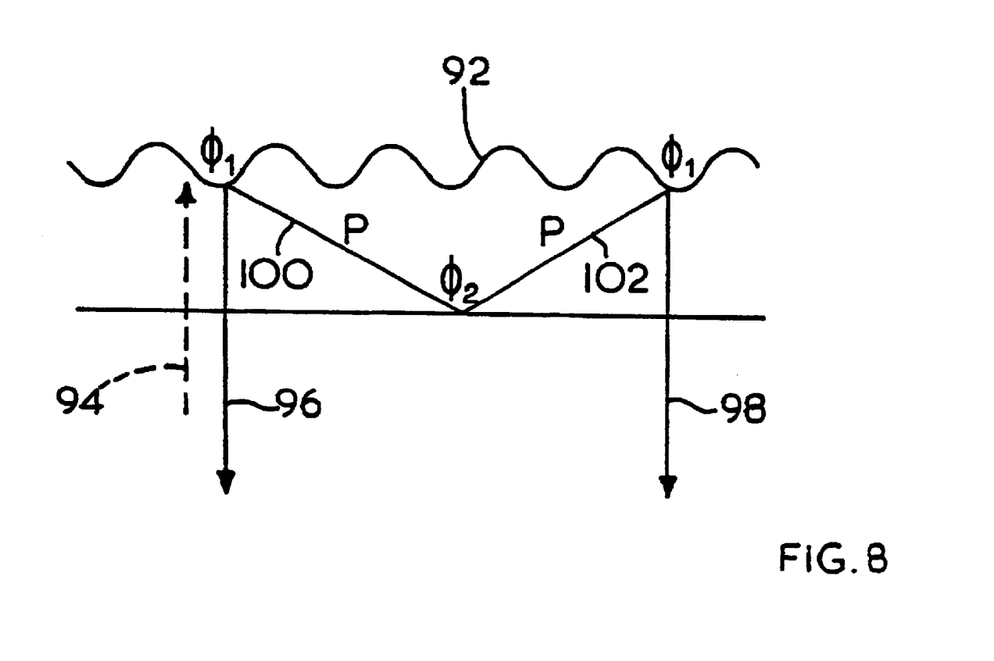
FIG. 8 shows schematically the grating surface of the VCSEL shown in FIG. 7 and the paths of a light beam incident on it from the VCSEL cavity and the paths of the two reflected light beams generated.

The second embodiment shown in FIGS. 7 and 8 comprises a VCSEL (90) with like parts identified by the same numerals as in FIGS. 1, 4 and 6. The VCSEL (90), the top part of which is shown in FIG. 7 comprises an upper Bragg stack (10) with a diffraction grating (92) formed on or alternatively in its upper surface. The reflecting properties of the grating (92) are demonstrated schematically in FIG. 8. Part of an incident beam of light (94) from the Bragg stack (10) (shown in dotted lines in FIG. 8) is reflected by the upper surface of the grating (92) to produce a beam (96) which propagates back into the Bragg stack (10). However, the upper surface of the grating (92) is suitably corrugated so that part of the incident beam (94) is diffracted at the interface between the upper surface of the grating (92) and the air above it into a waveguide mode in the layer of grating as shown by light beams (100,102). The light beams (100, 102) in the waveguide mode can also diffract from the interface between the upper surface of the grating (92) and the air above it, back into the Bragg stack (10) to produce a light beam (98). The relative phase between beams (96) and (98) (and any successive diffracted waveguide mode beams) will be determined by the phase shifts on reflection of the incident beam (96) and waveguide mode beam (102) at the upper surface of the grating (92), $\phi_1$ and the phase shift on reflection of the waveguide mode beam (100) at the lower surface of the grating (92) (where it interfaces with the Bragg stack (10)), $\phi_2$, as well as the extra path length (2P) of the beams (100,102) within the waveguide mode. If $(2\phi_1+\phi_2+2P)$ is a multiple of π then the beams (96) and (98)

will destructively interfere and so will reduce the overall reflectivity of the top mirror of the VCSEL (90). The path length 2P is determined by the angle of propagation of the beam (100) (ie. by the pitch of the corrugations in the upper surface of the grating (92)) and by the thickness of the grating layer (92). The phase shifts $\phi_1$ and $\phi_2$ are determined by the angle of propagation of the beam (100) and also by the polarisation of the incident beam (94). Thus, the grating pitch can be chosen so that it reduces the reflectivity of the top mirror of the VCSEL (90) for one polarisation of incident light (eg. (TM) polarisation where the E-field is perpendicular to the grooves in the grating (92)) whilst maintaining high reflectivity for the orthogonal polarisation (in this example (TE) polarisation). If the difference between the reflectivity of the upper mirror for the two modes is greater than a few percent, then the VCSEL (90) will lase with modes polarised in the direction that has the highest reflectivity (in this example the TE polarisation).

Figure 9:
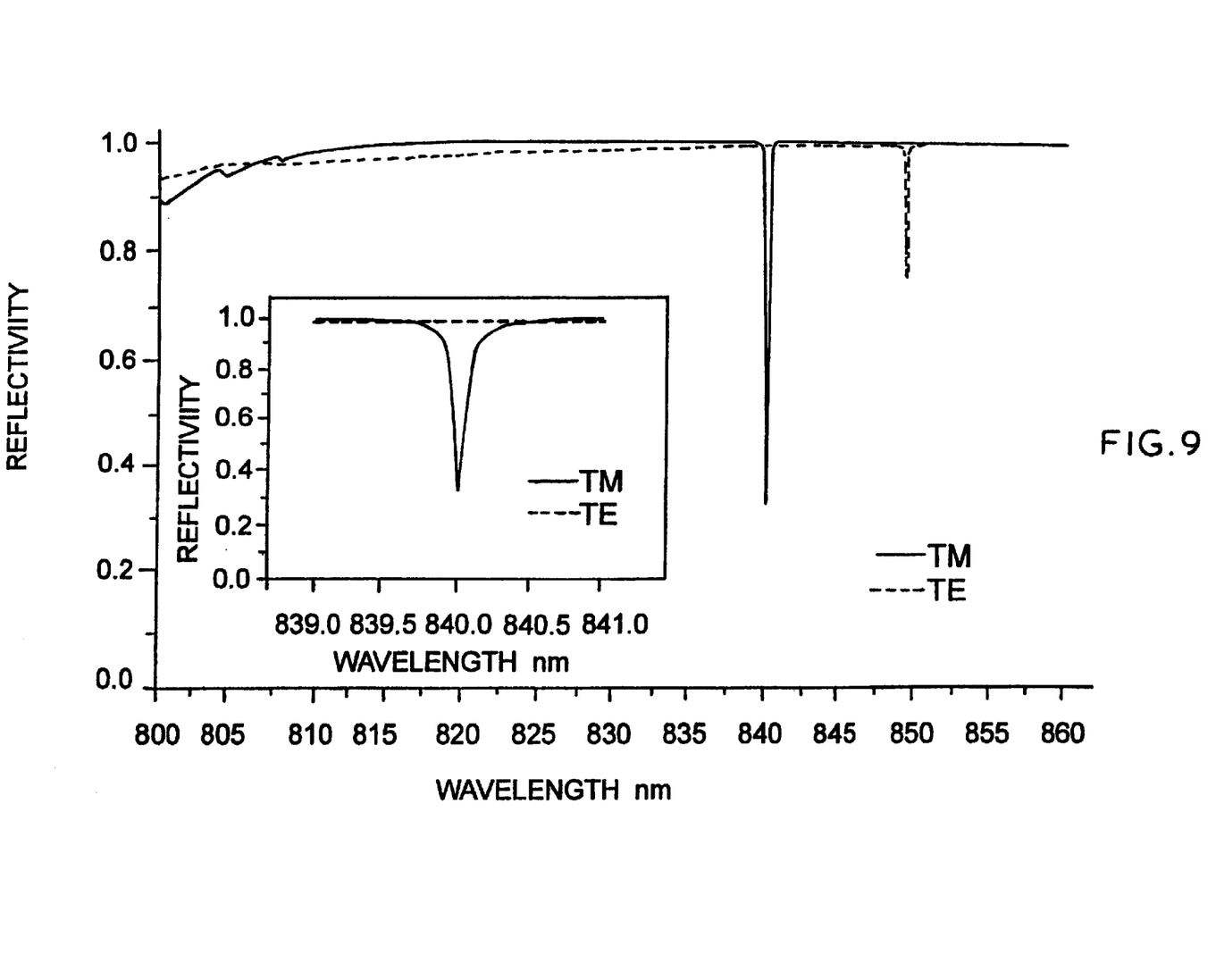
FIG. 9 shows a graph of reflectivity of the top Bragg mirror of the VCSEL of FIG. 7 against wavelength for two orthogonal polarisations.

The result from theoretical modelling of the top Bragg mirror (using rigorous coupled wave theory) of the VCSEL shown in FIG. 7 is shown in FIG. 9. A grating pitch was chosen so that with TM polarisation a mirror with reduced reflectivity at normal incidence is produced, whilst for the TE polarisation the reflectivity remains high at the operating wavelength of 840 nm at which the VCSEL is designed to operate. For this model in the structure in FIG. 7, there are 38 alternating layers of AlAs (n=2.971, k=0.0001) and $Al_{0.12}Ga_{0.78}As$ (n=3.505, k=0.0001) which are 70.68 nm and 59.9 nm thick respectively (ie. $\lambda/4$) grown on a GaAs substrate. The top grating layer is 266 nm thick and is corrugated on its top surface with a sinusoidal relief grating with a maximum depth of 106 nm. Thus, the VCSEL (90) would lase with the E-field pointing along the grating groves (TE polarisation). The corrugations in the grating layer (92) could be produced holographically in a photo-resist layer which could be spun on top of the top layer of the VCSEL. The corrugations could then be transferred into the semiconductor layer (92) by a suitable etching process.

What is claimed is:

1. A vertical cavity surface emitting laser (VCSEL), said VCSEL comprising:
    a cavity; and
    a one dimensional grating layer, wherein the layer is a first order one dimensional diffraction grating, said layer comprising a waveguide extending in a direction perpendicular to an axis of the VCSEL, said grating having a pitch such that a portion of the light from the cavity incident normal to the grating grooves is directly reflected back into the cavity and a portion of the light from the cavity incident normal to the grating grooves is indirectly reflected back into the cavity by being diffracted into the waveguide and subsequently diffracted back out of the waveguide and into the cavity, wherein light having a first polarisation is selectively promoted within the cavity as compared to light having a second orthogonal polarisation by the one dimensional grating layer, said grating layer arranged such that for the second polarisation of light the indirectly reflected light interferes destructively with the directly reflected light.

2. A VCSEL according to claim 1 wherein the one dimensional grating layer is located at an end of the VCSEL.

3. A VCSEL according to claim 2 wherein the one dimensional grating layer is located at the top end of the VCSEL.

4. A VCSEL according to claim 1 wherein the VCSEL emits light from a top end surface.

5. A VCSEL according to claim 1 wherein the VCSEL emits light from a bottom end surface.

6. A VCSEL according to claim 1 wherein the one dimensional grating layer reflects both the first and second orthogonal polarisations of light back into the cavity of the VCSEL.

7. A VCSEL according to claim 1 wherein the one dimensional grating layer preferentially reflects the first polarisation of light back into the cavity of the VCSEL.

8. A VCSEL according to claim 1 wherein the one dimensional grating layer preferentially transmits the first orthogonal polarisation.

9. A VCSEL according to claim 7 wherein the one dimensional grating layer preferentially absorbs the second orthogonal polarisation.

10. A VCSEL according to claim 1 additionally comprising a Bragg stack adjacent to the one dimensional grating layer for reflecting the first polarisation of light back into the cavity substantially in phase to promote constructive interference between reflected light of the first polarization.

11. A VCSEL according to claim 1 additionally comprising a Bragg stack adjacent to the one dimensional grating structure for reflecting the second polarisation of light back into the cavity substantially out of phase to promote destructive interference between reflected light of the second polarisation.

12. A VCSEL according to claim 1 wherein the cavity comprises;
    an upper Bragg mirror,
    a gain region, and
    a lower Bragg mirror,
    and the one dimensional grating layer is located in an end layer of the cavity adjacent to one of the Bragg mirrors and a layer adjacent to said one of the Bragg mirrors has a thickness such that the reflected light of the first polarisation constructively interferes with light of the first polarisation which is reflected by said one of the Bragg mirrors.

13. A VCSEL according to claim 1 wherein the cavity comprises;
    an upper Bragg mirror,
    a gain region, and
    a lower Bragg mirror,
    and the one dimensional grating structure is located in an end layer of the cavity adjacent to one of the Bragg mirrors and a layer adjacent to said one of the Bragg mirrors has a thickness such that the reflected light of the second polarisation destructively interferes with light of the second polarisation which is reflected by said one of the Bragg mirrors.

14. A VCSEL according to claim 12 wherein the layers of the Bragg mirrors are planar.

15. A method of controlling the polarisation of light emitted by a vertical cavity surface emitting laser (VCSEL) comprising the steps of:
    using a one dimensional grating layer for preferentially promoting gain of a first polarisation of light as compared to gain of a second polarisation of light within the VCSEL, said layer is a first order one dimensional diffraction grating which is formed as a layer of the VCSEL;
    configuring said layer to act as a waveguide in a direction perpendicular to the axis of the VCSEL; and
    configuring the grating to have a pitch chosen so that part of the light from the VCSEL cavity incident normal to the grating grooves is reflected directly back into the VCSEL cavity and part of the light from the VCSEL cavity incident normal to the grating grooves is indirectly reflected back into the VCSEL by being diffracted into the waveguide and subsequently diffracted back out of the waveguide and into the VCSEL cavity, wherein the reflected light interferes destructively with the directly reflected light.

16. A method according to claim 15 comprising the additional step of arranging the one dimensional grating to selectively reflect the first polarisation of light back into the cavity of the VCSEL.

17. A method according to claim 15 comprising the additional step of using a layer of a Bragg mirror of the VCSEL adjacent to the grating structure to change the phase of the reflected light from the one dimensional grating structure of the first polarisation such that the reflected light constructively interferes with light of the first polarisation which is reflected by other parts of the upper Bragg mirror.

18. A method according to claim 15 comprising the additional step of using a layer of a Bragg mirror of the VCSEL adjacent to the grating structure to change the phase of light reflected from the one dimensional grating structure of the second polarisation such that the reflected light of the second polarisation destructively interferes with light of the second polarisation which is reflected by other parts of the upper Bragg mirror.

19. A method according to claim 15 comprising the step of arranging the structure of the VCSEL such that the grating and an adjacent Bragg stack reflect the first polarization of light back into the VCSEL cavity substantially in phase to promote constructive interference between reflected light of the first polarisation.

20. A method according to claim 15 comprising the step of arranging the structure of the VCSEL such that the grating and an adjacent Bragg stack reflect the second polarisation of light back into the VCSEL cavity substantially out of phase to promote destructive interference between reflected light of the second polarisation.

21. A vertical cavity surface emitting laser (VCSEL) comprising:
  a cavity; and
  a one dimensional grating structure for selectively promoting gain of a first polarisation of light within the cavity as compared to gain of a second orthogonal polarisation of light within the cavity wherein the one dimensional grating structure comprises a corrugated metal mirror arranged such that light of the second polarisation incident on the mirror excites surface plasmon polaritons.

22. A VCSEL according to claim 21 wherein the pitch of the one dimensional corrugated metal mirror, $\lambda_G$, is determined by the following equation $$2\pi/\lambda_G = K_{SPP}$$

where $K_{SPP}$ is the wave vector of the surface plasmon polaritons.

23. A VCSEL according to claim 21 wherein the surface plasmon polaritons are generated at the interface between the one dimensional corrugated metal mirror and an upper Bragg mirror of the VCSEL.

24. A VCSEL according to claim 21 wherein the surface plasmon polaritons are generated at the interface between the one dimensional corrugated metal mirror and air.

25. A method of controlling the polarisation of light emitted by a vertical cavity surface emitting laser (VCSEL) comprising the steps of:
  using a one dimensional grating structure to selectively promote gain of a first polarisation of light within the VCSEL as compared to gain of a second orthogonal polarisation of light within the VCSEL, wherein the one dimensional grating structure comprises a corrugated metal mirror; and
  arranging said metal mirror such that light of the second polarisation incident on the mirror excites surface plasmon polaritons.

26. A method according to claim 25 wherein the pitch of the one dimensional corrugated metal mirror, $\lambda_G$, is determined by the following equation $$2\pi/\lambda_G = K_{SPP}$$

where $K_{SPP}$ is the wave vector of the surface plasmon polaritons.

27. A method according to claim 25 comprising the step of generating the surface plasmon polaritons at the interface between the one dimensional corrugated metal mirror and an upper Bragg mirror of the VCSEL.

28. A method according to claim 25 comprising the step of generating the surface plasmon polaritons at the interface between the one dimensional corrugated metal mirror and air.

* * * * *